(12) United States Patent
Ryudo et al.

(10) Patent No.: US 9,093,812 B2
(45) Date of Patent: Jul. 28, 2015

(54) METHOD OF MANUFACTURING A SEMICONDUCTOR LASER MODULE

(71) Applicant: Panasonic Intellectual Property Management Co., Ltd., Osaka (JP)

(72) Inventors: Makoto Ryudo, Hyogo (JP); Naoto Ueda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/556,042

(22) Filed: Nov. 28, 2014

(65) Prior Publication Data
US 2015/0087094 A1    Mar. 26, 2015

Related U.S. Application Data

(63) Continuation of application No. 13/993,373, filed as application No. PCT/JP2012/003122 on May 14, 2012.

(30) Foreign Application Priority Data

May 18, 2011    (JP) ................. 2011-110933

(51) Int. Cl.
*G02B 6/36* (2006.01)
*H01S 5/022* (2006.01)
(Continued)

(52) U.S. Cl.
CPC .......... *H01S 5/02284* (2013.01); *G02B 6/4237* (2013.01); *H01S 5/026* (2013.01); *H01S 5/02256* (2013.01); *H01S 5/4025* (2013.01); *G02B 6/4249* (2013.01)

(58) Field of Classification Search
USPC ........................................... 385/88
See application file for complete search history.

(56) References Cited

U.S. PATENT DOCUMENTS 4,818,062 A    4/1989  Scifres et al.
5,548,675 A *  8/1996  Shigematsu et al. ........... 385/80
(Continued)

FOREIGN PATENT DOCUMENTS

CN    201740890 U    2/2011
JP    63-161405 A    7/1988
(Continued)

OTHER PUBLICATIONS

English Translation of Chinese Search Report dated Nov. 27, 2014 for the related Chinese Patent Application No. 201280010921.5.
(Continued)

*Primary Examiner* — Uyen Chau N Le
*Assistant Examiner* — Hoang Tran
(74) *Attorney, Agent, or Firm* — Panasonic Patent Center

(57) ABSTRACT

A semiconductor laser module includes a laser diode array, an optical fiber array, a fiber array fitting for fixing the optical fiber array, a casing, and a support fitting for fixing the fiber array fitting and casing. The fiber array fitting and support fitting have a first contact section that is in line-contact or surface-contact with the plane section parallel with the light emission surface of the laser diode array, and are laser-welded and fixed to each other at the first contact section. The support fitting and casing have a second contact section that is in line-contact or surface-contact with the plane section vertical to the light emission surface of the laser diode array, and are laser-welded and fixed to each other at the second contact section.

12 Claims, 10 Drawing Sheets

(51) Int. Cl.
*G02B 6/42* (2006.01)
*H01S 5/026* (2006.01)
*H01S 5/40* (2006.01)

(56) References Cited

U.S. PATENT DOCUMENTS

| | | | |
|---|---|---|---|
| 6,905,257 B2 * | 6/2005 | Eichenberger et al. | ......... 385/89 |
| 2001/0041031 A1 | 11/2001 | Iwasaki | |
| 2003/0198443 A1 | 10/2003 | Iwasaki | |

FOREIGN PATENT DOCUMENTS

| JP | 64-074784 A | 3/1989 |
|---|---|---|
| JP | 02-298904 A | 12/1990 |
| JP | 08-201661 A | 8/1996 |
| JP | 08-313765 A | 11/1996 |
| JP | 2000-121869 A | 4/2000 |
| JP | 2001-281506 A | 10/2001 |
| JP | 2002-341196 A | 11/2002 |
| JP | 2004-326004 A | 11/2004 |
| JP | 2005-010374 A | 1/2005 |
| JP | 2008-186035 A | 8/2008 |

OTHER PUBLICATIONS

International Search Report for Application No. PCT/JP2012/003122, dated Aug. 14, 2012.

* cited by examiner

Movement in positive direction of Z axis

Movement in negative direction of Z axis

METHOD OF MANUFACTURING A SEMICONDUCTOR LASER MODULE

This application is a Continuation of application Ser. No. 13/993,373, filed on Jun. 12, 2013, which is the U.S. National Phase under 35 U.S.C. §371 of International Application PCT/JP2012/003122, filed on May 14, 2012, which in turn claims the benefit of Japanese Application No. 2011-110933, filed on May 18, 2011. The disclosures of these applications including the specifications, the drawings, and the claims are hereby incorporated by reference in its entirety.

BACKGROUND

1. Technical Field

The present invention relates to a method of aligning a laser diode array and optical fiber array and a method of fixing the components of them, in a laser diode and a semiconductor laser module where a laser beam emitted from the laser diode is optically coupled to an optical fiber, relates to a semiconductor laser module using the aligning method and fixing method, and relates to a method of manufacturing the semiconductor laser module.

2. Background Art

As the output of a laser diode recently increases, a laser processing apparatus using the laser diode as a light source or excitation source is widely used for various material processing such as welding, deposition, cutting, and modification.

In order to efficiently transmit a laser beam output from a laser diode to an optical fiber, a semiconductor laser module using the laser diode generally has the following configuration:

the laser diode and optical fiber are precisely aligned, and are fixed to respective holding members so as to prevent deviation of alignment.

These holding members are fixed to predetermined positions using one of laser welding, soldering, and an adhesive, or a combination of them (for example, Unexamined Japanese Patent Publication No. 2002-341196).

As a semiconductor laser module for industrial use, a semiconductor laser module including a laser diode array where a plurality of light emitters is arranged in parallel and at least as many optical fibers as the light emitters of the laser diode array are arranged in parallel is disclosed (for example, U.S. Pat. No. 4,818,062 and Unexamined Japanese Patent Publication No. 2005-010374).

Recently, a semiconductor laser module is developed where the luminance at the light intensity per light emitter of a laser diode is high, about 10 W, and the fiber output is 100 W or higher. In the optical fiber array of the semiconductor laser module of high output, as many multimode optical fibers as the light emitters are fixed on a substrate in parallel with a pitch that is equal to the interval between the light emitters. Here, the multimode optical fibers have a core radius that is equal to or larger than the width of each light emitter of the laser diode array. The optical fiber array is aligned to the laser diode array so that the light intensity output from the optical fiber array is the highest, and is fixed on a casing by various fixing methods discussed above. The alignment of the laser diode array and optical fiber array is performed in a lump by attaching the optical fiber array to a precise fixture or precise stage (for example, Unexamined Japanese Patent Publication No. 2004-326004 and Unexamined Japanese Patent Publication No. 2008-186035).

The alignment of the laser diode array and optical fiber array is performed with reference to a total of six axes. In other words, the alignment includes alignment in the X axis, Y axis, and Z axis directions of the optical fiber array and alignment about rotation angles $X\theta$, $Y\theta$, and $Z\theta$ about the X axis, Y axis, and Z axis, as shown in Unexamined Japanese Patent Publication No. 2005-010374 or the like.

Generally, the alignment is performed by monitoring the light intensity input to the optical fibers and adjusting the six axes so that the highest light intensity is obtained. Especially regarding the optical fiber array, the alignment is performed with reference to each axis using the sum of the light intensities of a plurality of optical fibers or all optical fibers or using the light intensities of selected optical fibers at typical positions such as the center or both ends of the optical fiber array The laser beam output from the light emitter of the laser diode spreads in the thickness direction (fast axis) and the width direction (slow axis) at different spread angles. Therefore, when the laser diode and optical fiber array are aligned by collimating the laser beam, the tolerance of the alignment position capable of providing a desired optical coupling is different between the axes dependently on the beam form.

Especially, it is known that the alignment position on the Y axis corresponding to the thickness direction of the laser diode is sensitive to the optical coupling efficiency and light beam quality (e.g. NA (numerical aperture)) after light guide of the optical fibers. In addition, the alignment about $Z\theta$ includes the Y-direction component in the alignment of the laser diode array and optical fiber array, so that the alignment about $Z\theta$ is more complicated.

Recently, the semiconductor laser module for industrial use especially requires not only higher optical coupling efficiency but also a high-quality spread angle (NA) of light output beam, so that the appropriate range of the alignment position is narrow. For example, when the optical coupling efficiency of the laser diode array and optical fiber array is about 90% and the output beam quality from each optical fiber is about NA 0.12, the range on the Y axis satisfying these values is narrow, namely about 1.5-2.0 µm Thus, the alignment of the laser diode array and optical fiber array requires a high-function and high-accuracy aligning mechanism. This aligning mechanism, for example, is a sensing means and aligning procedure for determining the alignment position allowing the desired optical coupling, or a precise stage for performing six-axis control and performing positioning at a tolerance required for the alignment position.

Furthermore, the alignment requires an optical fiber array fixing method for keeping the alignment position allowing the desired optical coupling, and a member configuration appropriate for the fixing method. By using an aligning apparatus including these components, a high-performance and high-reliability semiconductor laser module can be assembled and manufactured.

As in the aligning apparatus disclosed by Unexamined Japanese Patent Publication No. 2008-186035, various methods of performing precise alignment so that the optical coupling between the laser diode array and optical fiber array becomes desired are proposed. Many methods have been commercialized. Also in the aligning mechanism, the function and accuracy of the precise stage are recently, extremely improved, and hence the six-axis control and the positioning of the optical fiber array can be performed in units of sub-micrometers without problems.

While, the optical fiber array fixing method and the member configuration appropriate for the fixing method have many problems. In the fixing method of an optical member such as an optical fiber array, an adhesive is generally used. This is because an adhesive works as a filler for filling the clearance between the optical member and a member or casing for holding it, hence the positional relationship between the members is allowed to be relatively unclear, and the handling and assembling are made easy.

However, the volume varies in the contraction direction when the adhesive hardens, so that the optical fibers can deviate from the alignment position, the optical output and light beam quality can reduce, and hence the yield of the products can reduce. In the actual manufacturing, extremely much study time and know-how are required for correcting the deviation corresponding to the contraction from the alignment position in consideration of the hardening and contraction of the adhesive, for example. The semiconductor laser module after the manufacturing has problems in securing the long-term reliability, such as aging degradation of a bonding section, deviation from the alignment position, and drop of a member.

As discussed above, the recent semiconductor laser module for industrial use requires higher output, higher efficiency, and higher beam quality, so that the tolerance of the alignment position is extremely narrow. When the optical fiber array is used, the total volume and weight are several times those when only one optical fiber and micro-optics are used. Inevitably, the amount of used adhesive also increases, and the possibility that the above-mentioned problems related to the adhesive become more remarkable is high.

As the fixing method that compensates for the problems caused by the hardening/contraction and aging degradation of the adhesive, laser welding is used. The laser welding is a process of locally heating and melting/bonding a part to be fixed for an extremely short time, and the aging degradation that can occur in the adhesive hardly occurs.

However, the laser welding is local heating in principle. The laser welding is therefore sensitive to the clearance between the members to be welded and the accuracy of the mating surface, and strict management of the state between the members to be fixed is required differently from the adhesive. When the clearance between the members and the accuracy of the mating surface are insufficient even if the laser welding/fixing is enabled, the optical fibers can deviate from the alignment position due to coagulation/contraction from the molten state. In other words, when the clearance between the optical fiber array and the holding member and the accuracy of the mating surface are secured sufficiently in fixing the optical fiber array, fixing accuracy and reliability that cannot be obtained by the adhesive can be obtained. The laser welding requires an additional stage adjusting mechanism for mating the laser welding joint surface in addition to the six-axis required for alignment, and hence an extremely complicated aligning apparatus is required.

An example of the semiconductor laser module using an optical fiber array, which includes the aligning method, is disclosed by Unexamined Japanese Patent Publication No. 2005-010374, for example. The following method is proposed:
  a guide plate for positioning the optical fiber array is previously disposed between the laser diode array and optical fiber array, and is used as the reference for positioning (for example, the optical fiber array is butted on the guide plate), thereby reducing the number of alignment axes.

When the laser diode array is mounted on a sub-mount, a mounting displacement or rotation displacement of several micrometers inevitably occurs because the size of the laser diode chip is relatively large, namely about several millimeters per side. The relationship in alignment position between the laser diode array and optical fiber array is in the order of micrometers. Therefore, the individual difference of the mounted position of the laser diode array must be corrected and absorbed in units of micrometers using the guide plate. It is extremely difficult that this work is performed by the individual semiconductor laser module. When the laser welding is used as the fixing method, it is also difficult that the clearance between the welded parts and the accuracy of the mating surface are secured by the individual semiconductor laser module.

SUMMARY

The present invention addresses the above-mentioned problems. The present invention provides a method of laser-welding and fixing an optical fiber array without performing additional adjustment and positioning other than the so-called six-axis alignment in order to obtain a desired optical coupling, in a semiconductor laser module where a laser diode array is optically coupled to the optical fiber array. The present invention also provides a semiconductor laser module that has high reliability and is assembled at a high accuracy using the fixing method, and a method of manufacturing the semiconductor laser module.

In order to address the above-mentioned problems, a semiconductor laser module of the present invention includes the following elements:
  a laser diode array;
  an optical fiber array having optical fibers arranged on a substrate;
  a fiber array fitting for fixing the optical fiber array;
  a casing for supporting at least the laser diode array and optical fiber array; and
  a support fitting for fixing the fiber array fitting and casing.
The fiber array fitting and support fitting have a first contact section that is in line-contact or surface-contact with the plane section parallel with the light emission surface of the laser diode array, and are fixed to each other by a first laser welded section in the first contact section. The support fitting and casing have a second contact section that is in line-contact or surface-contact with the plane section vertical to the light emission surface of the laser diode array, and are fixed to each other by a second laser welded section in the second contact section.

Thanks to this configuration, the mating of the welded section required for alignment using laser welding can be performed accurately and easily. Thus, optical coupling of high accuracy and high quality can be obtained, and the alignment position does not deviate when the optical fiber array is fixed. Therefore, a semiconductor laser module that has high manufacturing yield, no aging degradation, and high reliability can be provided.

A method of manufacturing a semiconductor laser module of the present invention is a method of manufacturing the semiconductor laser module that includes the following elements:
  a laser diode array;
  an optical fiber array having optical fibers arranged on a substrate;
  a fiber array fitting for fixing the optical fiber array;
  a casing for supporting at least the laser diode array and optical fiber array; and
  a support fitting for fixing the fiber array fitting and casing.
In the method of manufacturing the semiconductor laser module of the present invention, the fiber array fitting and support fitting have a first contact section that is in line-contact or surface-contact with the plane section parallel with the light emission surface of the laser diode array, and are fixed to each other by a first laser welded section in the first contact section. The support fitting and casing have a second contact section that is in line-contact or surface-contact with the plane section vertical to the light emission surface of the laser diode array, and are fixed to each other by a second laser welded section in the second contact section.

Thanks to this method, the mating of the welded section required for alignment using laser welding can be performed accurately and easily. Thus, optical coupling of high accuracy and high quality can be obtained, and the alignment position does not deviate when the optical fiber array is fixed. Therefore, a semiconductor laser module that has high manufacturing yield, no aging degradation, and high reliability can be provided.

DESCRIPTION OF EMBODIMENTS

Exemplary embodiments of the present invention will be described hereinafter with reference to the accompanying drawings. In the accompanying drawings, the same elements are denoted with the same reference marks, and the descriptions of those elements are omitted.

First Exemplary Embodiment

Figure 1A:
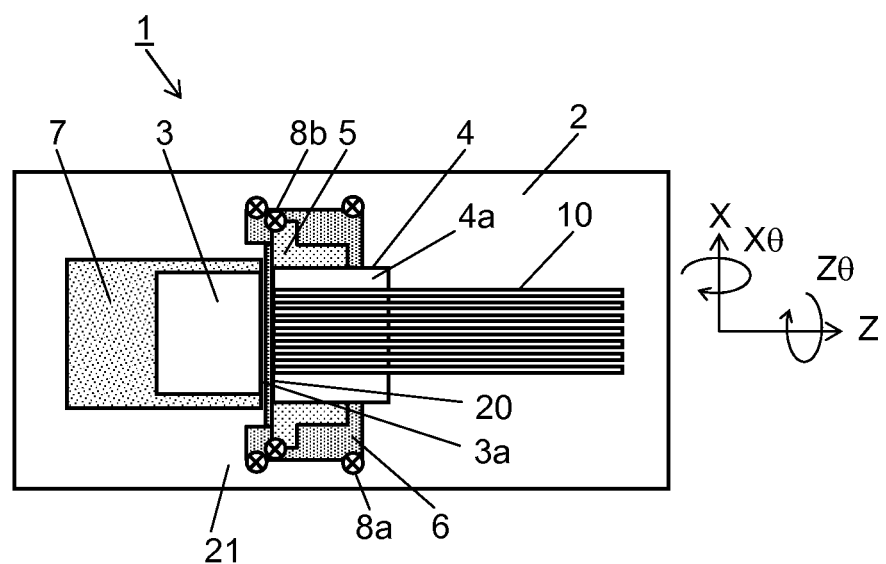
FIG. 1A is a plan view showing the whole configuration of a semiconductor laser module in accordance with a first exemplary embodiment of the present invention.
Figure 1B:
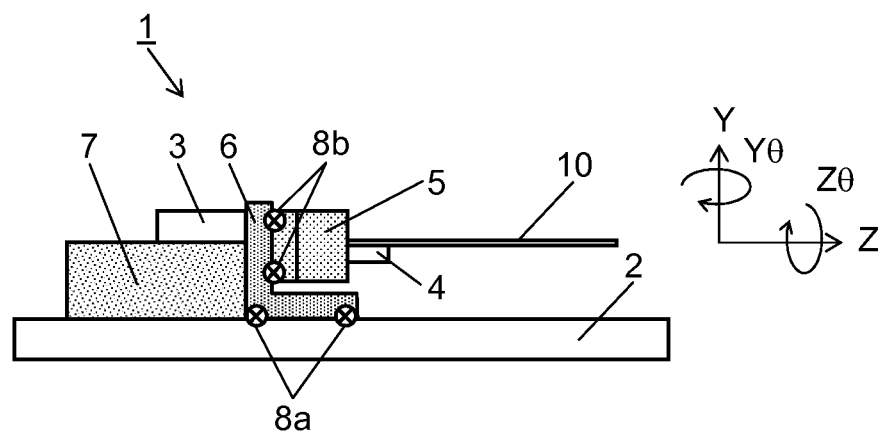
FIG. 1B is a side view showing the whole configuration of the semiconductor laser module in accordance with the first exemplary embodiment of the present invention.
Figure 2A:
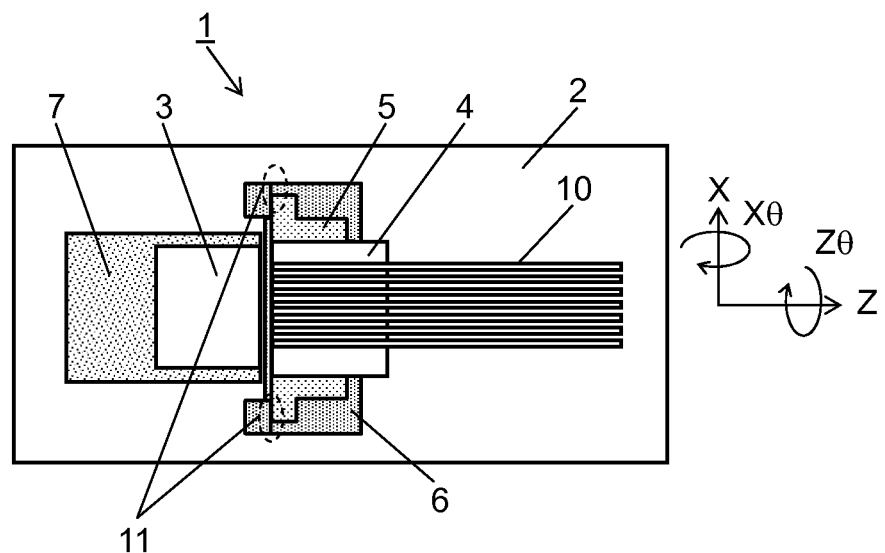
FIG. 2A is a plan view showing a first contact section between a fiber array fitting and a support fitting of the semiconductor laser module in accordance with the first exemplary embodiment of the present invention.
Figure 2B:
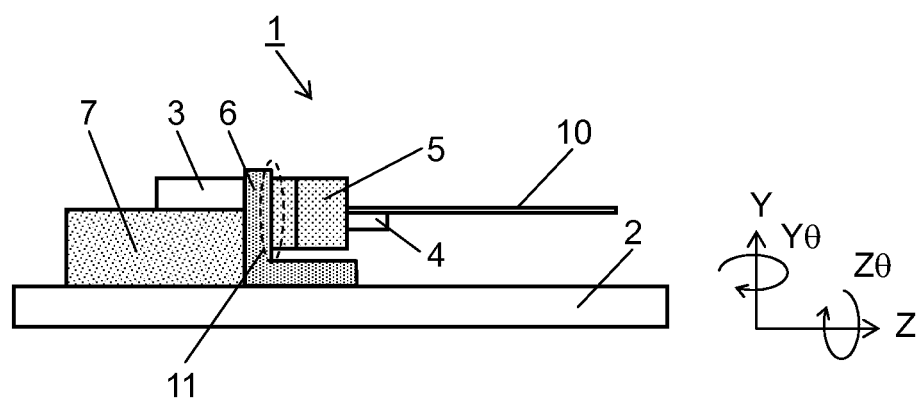
FIG. 2B is a side view showing the first contact section between the fiber array fitting and the support fitting of the semiconductor laser module in accordance with the first exemplary embodiment of the present invention.
Figure 3A:
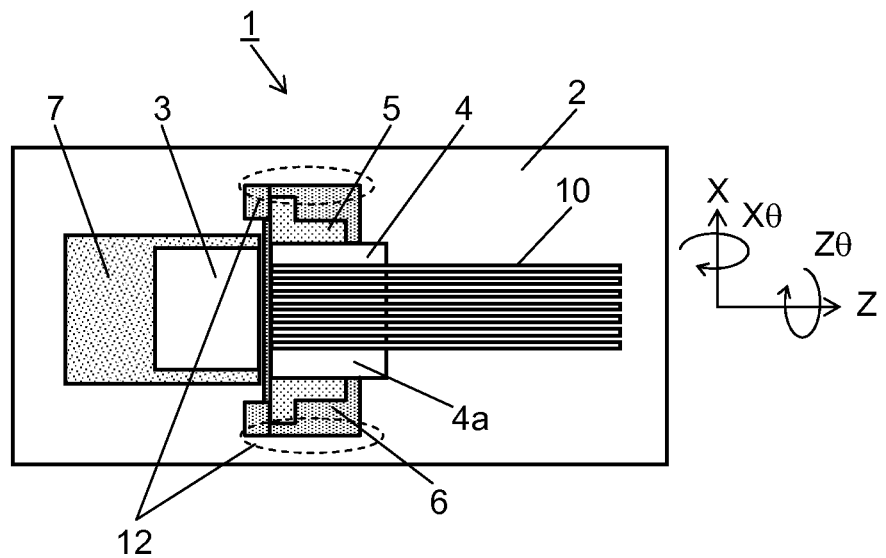
FIG. 3A is a plan view showing a second contact section between the support fitting and a casing of the semiconductor laser module in accordance with the first exemplary embodiment of the present invention.
Figure 3B:
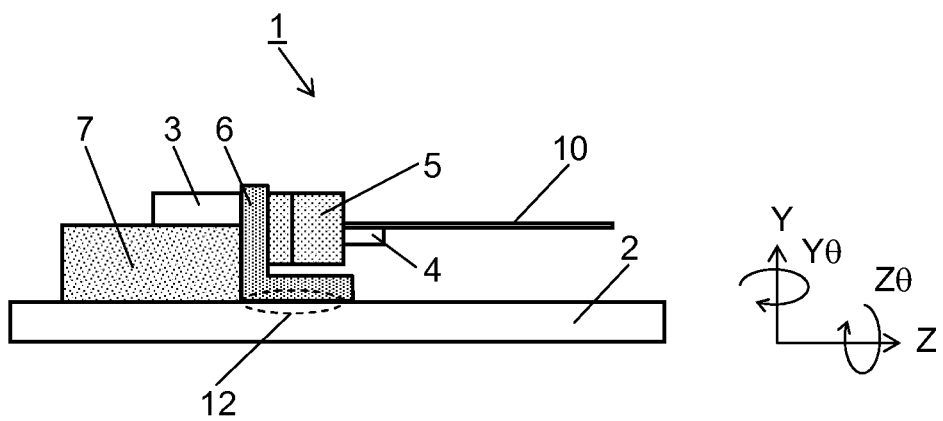
FIG. 3B is a side view showing the second contact section between the support fitting and the casing of the semiconductor laser module in accordance with the first exemplary embodiment of the present invention.

FIG. 1A and FIG. 1B are a plan view and side view showing semiconductor laser module 1 in accordance with a first exemplary embodiment of the present invention. FIG. 2A and FIG. 2B are a plan view and side view showing first contact section 11 between fiber array fitting 5 and support fitting 6 of semiconductor laser module 1 in accordance with the first exemplary embodiment of the present invention. FIG. 3A and FIG. 3B are a plan view and side view showing second contact section 12 between support fitting 6 and casing 2 of semiconductor laser module 1 in accordance with the first exemplary embodiment of the present invention.

As shown in FIG. 1, semiconductor laser module 1 of the first exemplary embodiment includes casing 2, laser diode array 3, optical fiber array 4, fiber array fitting 5, and support fitting 6. Laser diode array 3 is mounted on sub-mount 7. Optical fiber array 4 has optical fibers 10 arranged on substrate 4a. Fiber array fitting 5 fixes optical fiber array 4. Support fitting 6 fixes fiber array fitting 5 to casing 2.

Optical fiber array 4 is fixed to fiber array fitting 5 by an adhesive, soldering, or laser welding before aligning work. The member fixing after alignment requires compatibility between securing the position accuracy and securing the fixing strength regardless of the fixing method. However, since the fixing of optical fiber array 4 to fiber array fitting 5 is performed before alignment, this fixing is relatively easy and does not require strict management against some displacement that is caused by hardening/contraction or coagulation/contraction. Thus, optical fiber array 4 and fiber array fitting 5 are completely integrated when they are aligned to laser diode array 3.

Laser diode array 3 is also called a laser diode (LD) bar, and has a structure where a plurality of laser diodes is arranged in parallel and light emitters for emitting laser beams are arranged side-by-side in parallel. The input end of laser diode array 3 is faced to the input end of optical fiber array 4 so that the beam emitted from each light emitter comes to the input end of optical fiber array 4.

In optical fiber array 4, a plurality of optical fibers 10 is bonded and fixed in parallel on a substrate in which fixing grooves of the optical fibers, such as V grooves, are precisely processed. As many optical fibers 10 as the light emitters of laser diode array 3 are arranged on the substrate with a pitch equal to the interval between the light emitters.

The alignment between laser diode array 3 and optical fiber array 4 is performed in a lump because optical fibers 10 are fixed in parallel on the substrate. In other words, the position of optical fiber array 4 is adjusted so that the optical axis of an input core of corresponding optical fiber 10 matches with each optical axis of laser diode array 3 and so that the input light intensity to optical fiber 10 is the highest.

The alignment of optical fiber array 4 is performed with reference to the following six axes as shown in FIG. 1A and FIG. 1B:

X axis direction along the light emission surface of laser diode array 3;

Y axis direction as the thickness direction of laser diode array 3;

Z axis direction along the optical axis of an irradiation beam; and angles Xθ, Yθ, and Zθ as angle adjustment in the rotation direction about the X axis, Y axis, and Z axis.

Fiber array fitting 5 and support fitting 6 are in line-contact or surface-contact with each other on a part of plane section 20 parallel with light emission surface 3*a* of laser diode array 3, namely plane section 20 parallel with the X-Y plane.

The parts surrounded with the broken lines in FIG. 2A and FIG. 2B indicate first contact section 11 between fiber array fitting 5 and support fitting 6. Fiber array fitting 5 is fixed to support fitting 6 by laser-welding the interface of first contact section 11. FIG. 1A and FIG. 1B show laser welded sections 8*b* as an example of fixing by laser welding. Fiber array fitting 5 is welded and fixed to support fitting 6 by performing laser spot welding at a total of four points, namely two points (upper and lower) on each of the right and left sides. For the laser welding, a YAG (yttrium aluminum garnet) laser welder emits a pulse of an energy of 30 J (joule) at a laser spot diameter of 200 µm and a pulse width of 5 msec. The welded surface at this time is the mating surface between fiber array fitting 5 and support fitting 6. In YAG laser welding, however, the accuracy of the mating surface is especially important. Fiber array fitting 5 and support fitting 6 are made of metal (e.g. SUS (steel use stainless)) containing iron, for example.

Support fitting 6 and casing 2 are in line-contact or surface-contact with each other on plane section 21 vertical to light emission surface 3*a* of laser diode array 3, namely plane section 21 parallel with the Z-X plane.

The parts surrounded with the broken lines in FIG. 3A and FIG. 3B indicate second contact section 12 between support fitting 6 and casing 2. Support fitting 6 is fixed to casing 2 by laser-welding the interface of second contact section 12. FIG. 1A and FIG. 1B show laser welded sections 8*a* as an example. Support fitting 6 is welded and fixed to casing 2 by performing laser spot welding at a total of four points, namely two points (right and left) on each of the side close to laser diode array 3 and the side far from laser diode array 3.

The welding/fixing method is not limited to laser welded sections 8*a* and 8*b* of this example. The following various welding examples are used:

laser spot welding where the number of welding parts is altered; and stitch welding or continuous welding other than laser spot welding.

A welding condition allowing securement of the welding strength and position accuracy is appropriately selected in response to the object to be welded.

In order to secure the alignment position accuracy while minimizing the influence of the coagulation/contraction by laser welding, the mating accuracy of first contact section 11 and second contact section 12 is important.

Recent performance of machining apparatuses and development of the processing technology are remarkable, and hence both of first contact section 11 and second contact section 12 can be sufficiently processed so that the flatness and roughness achieve a required mating accuracy (for example, flatness of 10 µm, Ra (arithmetic mean roughness) of 0.8 µm, and verticality of 10 µm). First contact section 11 becomes parallel with the X-Y plane and second contact section 12 becomes parallel with the Z-X plane, but they can be sufficiently processed at a required parallelism (for example, flatness of 10 µm, Ra of 0.8 µm, and verticality of 10 µm).

Figure 4:
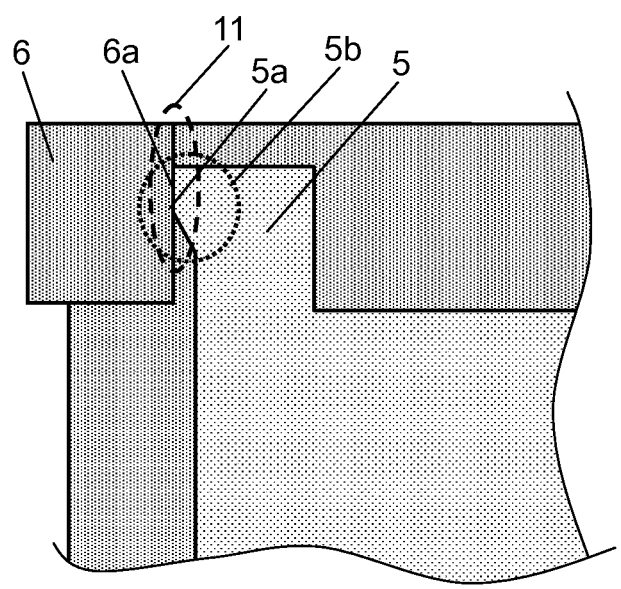
FIG. 4 is an enlarged view of an essential part of a contact section between the fiber array fitting and the support fitting of the semiconductor laser module in accordance with the first exemplary embodiment of the present invention.

FIG. 4 is an enlarged view of an essential part of first contact section 11 between fiber array fitting 5 and support fitting 6 of semiconductor laser module 1 in accordance with the first exemplary embodiment of the present invention. FIG. 4 shows an example of a processing method for accurately mating fiber array fitting 5 with support fitting 6 via the first contact section 11. When the mating via the first contact section 11 is not accurate, the welding and fixing by YAG laser welding is difficult.

In fiber array fitting 5, first contact section 11 is cut while a required minimum area is kept near the place for laser welding. By this cutting, as shown in FIG. 4, projecting section 5*b* having contact surface 5*a* of fiber array fitting 5 is formed at each of right and left ends of fiber array fitting 5. Here, contact surface 5*a* comes into contact with contact surface 6*a* of support fitting 6 at first contact section 11. Such processing can prevent contact at a part separated from the place for laser welding. Here, the place is the proximity of first contact section 11. The state of first contact section 11 observed from the outside substantially matches with the actual contact section, so that mating work and state recognition can be performed accurately.

In other words, fiber array fitting 5 may have the following configuration:

fiber array fitting 5 has projecting section 5*b* on each of the right and left ends, and the contact surface of projecting section 5*b* comes into contact with contact surface 6*a* of support fitting 6 to form first contact section 11. This configuration allows accurate mating work and state recognition.

Also in second contact section 12, the mating accuracy can be secured by similarly cutting the contact surface (not shown) of support fitting 6 that comes into contact with the contact surface (not shown) of casing 2. By securing the mating accuracy, welding and fixing can be certainly performed by YAG laser welding.

Even in the laser diode array accurately mounted using precisely machined members as discussed above, inclination of the processed surface and mounting displacement occur within a tolerance. As discussed above, it is known that the tolerance of the alignment position allowing a desired optical coupling is several micrometers and there is an alignment axis for which alignment and fixing must be performed in this tolerance. Even slight inclination of the processed surface affects the alignment accuracy, and a possibility arises where desired light intensity or beam quality cannot be obtained.

Figure 5:
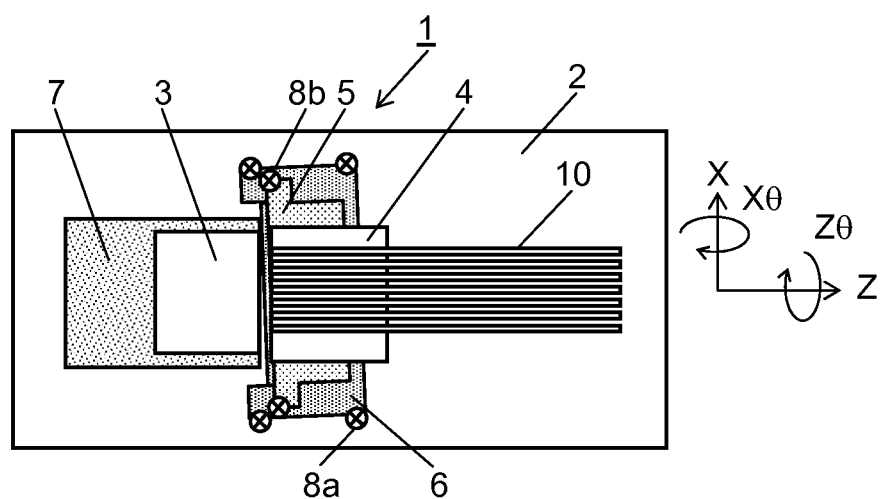
FIG. 5 is a plan view showing an assembling example of the semiconductor laser module in accordance with the first exemplary embodiment of the present invention.

FIG. 5 is a plan view showing an assembling example of semiconductor laser module 1 in accordance with the first exemplary embodiment of the present invention. FIG. 5 illustrates the arrangement of each member when optical fiber array 4 is slightly rotated on the X-Z plane (vertical to light emission surface 3*a* of laser diode array 3) and fixed to fiber array fitting 5. For the sake of simplifying the description, the rotation degree of optical fiber array 4 is emphasized in FIG. 5.

As shown in FIG. 5, when alignment is performed in a state where optical fiber array 4 is slightly rotated and fixed to fiber array fitting 5, fiber array fitting 5 rotates and then is arranged. Even in such a case, however, when support fitting 6 is arranged in a state where the mating accuracy with fiber array fitting 5 is secured as shown in FIG. 4, optical fiber array 4 can be laser-welded and fixed without deviation from the alignment position.

In other words, the following configuration may be employed:

support fitting 6, due to the own weight, is in line-contact or surface-contact with casing 2 on plane section 21 vertical to light emission surface 3a of laser diode array 3 when optical fiber array 4 is aligned. Thanks to this configuration, support fitting 6 is arranged in a state where the mating accuracy with fiber array fitting 5 is secured, and optical fiber array 4 can be laser-welded and fixed without deviation from the alignment position.

Figure 6:
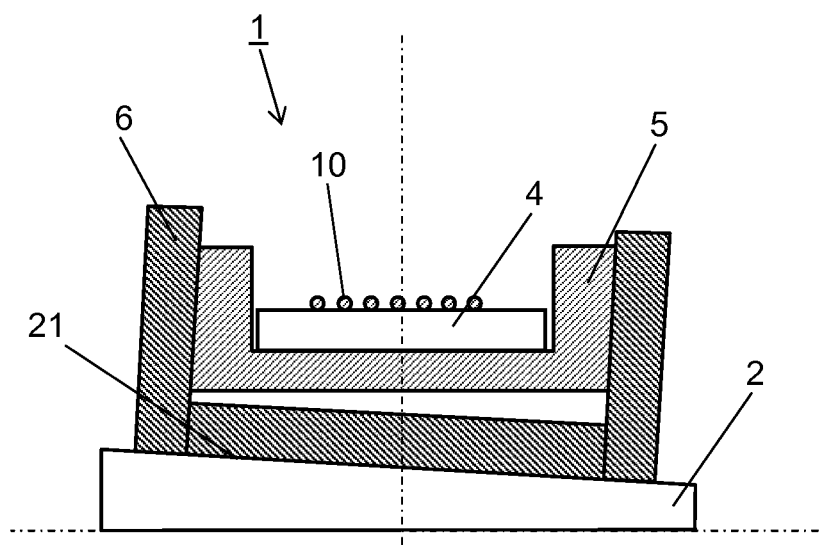
FIG. 6 is a side view showing the assembling example of the semiconductor laser module in accordance with the first exemplary embodiment of the present invention.
Figure 6:
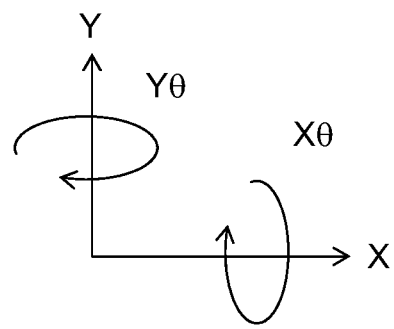

FIG. 6 is a side view showing the assembling example of semiconductor laser module 1 in accordance with the first exemplary embodiment of the present invention. FIG. 6 illustrates the arrangement of each member when plane section 21 of casing 2 for fixing support fitting 6 is slightly inclined and processed. For the sake of simplifying the description, the inclination of plane section 21 of casing 2 is emphasized in FIG. 6. FIG. 6 shows the arrangement around the optical fiber array 4 from the viewpoint of the light emission surface side of laser diode array 3. Therefore, laser diode array 3 is omitted in FIG. 6.

As shown in FIG. 6, when plane section 21 of casing 2 is slightly inclined and processed, support fitting 6 mated with casing 2 is arranged at the same inclination. However, fiber array fitting 5 having undergone alignment can be arranged in a state where the mating accuracy with support fitting 6 is secured without being affected by the inclination. Therefore, optical fiber array 4 is arranged integrally with fiber array fitting 5, so that optical fiber array 4 can be laser-welded and fixed without deviation from the alignment position similarly to the above-mentioned case.

Also for slight mounting displacement such as Yθ direction rotation or Zθ direction inclination of laser diode array 3, the member arrangement of the optical fiber array 4 is similar to the above-mentioned case, and the optical fiber 4 array can be laser-welded and fixed without deviation from the alignment position.

As discussed above, in the fixing method of optical fiber array 4 in combination with fiber array fitting 5 and support fitting 6, the mating accuracy is secured. Therefore, optical fiber array 4 can be laser-welded and fixed without deviation from the alignment position, and the influence of the deviation of the alignment position by the processing accuracy of members and the mounting accuracy of the semiconductor laser can be canceled.

Thus, in the present invention, the optical fiber array can be accurately laser-welded and fixed. Therefore, the manufacturing yield can be remarkably increased, and hence a semiconductor laser module that has no aging degradation, high performance, and high reliability and a method of manufacturing the semiconductor laser module can be provided.

Second Exemplary Embodiment

Figure 7A:
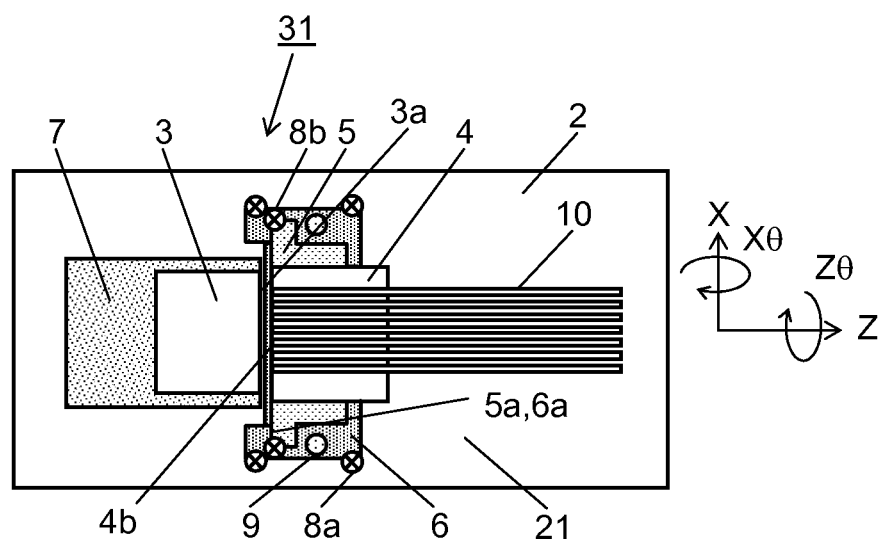
FIG. 7A is a plan view showing the whole configuration of a semiconductor laser module in accordance with a second exemplary embodiment of the present invention.
Figure 7B:
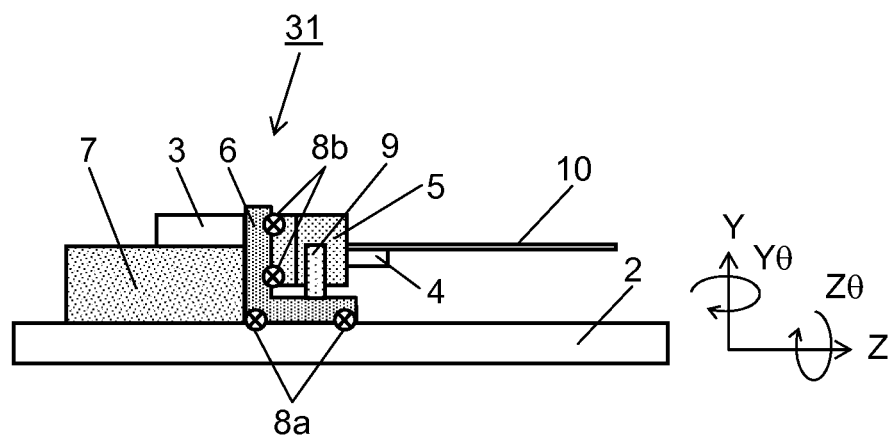
FIG. 7B is a side view showing the whole configuration of the semiconductor laser module in accordance with the second exemplary embodiment of the present invention.

FIG. 7A and FIG. 7B are a plan view and side view showing semiconductor laser module 31 in accordance with a second exemplary embodiment of the present invention. Similarly to semiconductor laser module 1 shown in the first exemplary embodiment, semiconductor laser module 31 includes casing 2, laser diode array 3, optical fiber array 4, fiber array fitting 5, and support fitting 6. Laser diode array 3 is mounted on sub-mount 7. Optical fiber array 4 has optical fibers 10 arranged on substrate 4a. Fiber array fitting 5 fixes optical fiber array 4. Support fitting 6 fixes fiber array fitting 5 to casing 2.

Semiconductor laser module 31 of the second exemplary embodiment differs from semiconductor laser module 1 of the first exemplary embodiment in that guide pins 9 are press-fitted into support fitting 6 as shown in FIG. 7A and FIG. 7B.

During alignment before laser welding, support fitting 6 is in contact with casing 2 due to the own weight. Guide pins 9 guides support fitting 6 so that support fitting 6 follows the movement of fiber array fitting 5 in the Z-X plane during alignment.

During the operation, support fitting 6 and casing 2 are in line-contact or surface-contact with each other due to the own weight of support fitting 6 on the plane vertical to light emission surface 3a of laser diode array 3, namely plane section 21 parallel with the Z-X plane.

In FIG. 7A and FIG. 7B, laser diode array 3 and optical fiber array 4 are aligned, and fiber array fitting 5 is laser-welded and fixed to casing 2 by support fitting 6.

In other words, in the state of semiconductor laser module 31 of FIG. 7A and FIG. 7B, contact surfaces 5a and 6a between fiber array fitting 5 and support fitting 6 and light receiving surface 4b of optical fiber array 4 are parallel with light emission surface 3a of laser diode array 3. Therefore, Xθ alignment in six-axis alignment of laser diode array 3 and optical fiber array 4 can be replaced by the combination of mating between fiber array fitting 5 and support fitting 6 and Yθ alignment in six axes. In other words, mating between fiber array fitting 5 and support fitting 6 is performed, and laser diode array 3 and optical fiber array 4 are aligned with reference to five axes other than Xθ alignment.

The beam of the Xθ rotation direction entering optical fiber array 4 is obtained by collimating a beam of the fast vibration direction emitted from laser diode array 3.

The collimated beam of the fast vibration direction has an extremely high beam quality (NA). Even if there is some deviation between the optical axis of the beam entering optical fiber array 4 and the optical axis of the longitudinal direction along the light propagation direction of the optical fibers, the optical coupling efficiency to the optical fibers and the beam quality output from optical fiber array 4 are hardly affected.

In other words, the work that fiber array fitting 5 is operated at a high-accuracy stage to adjust the mating with support fitting 6 means the alignment of the Xθ rotation direction. Therefore, the alignment is not required where the light intensity input to the optical fibers is monitored and the Xθ axis is adjusted so that the light intensity is the highest.

Figure 8:
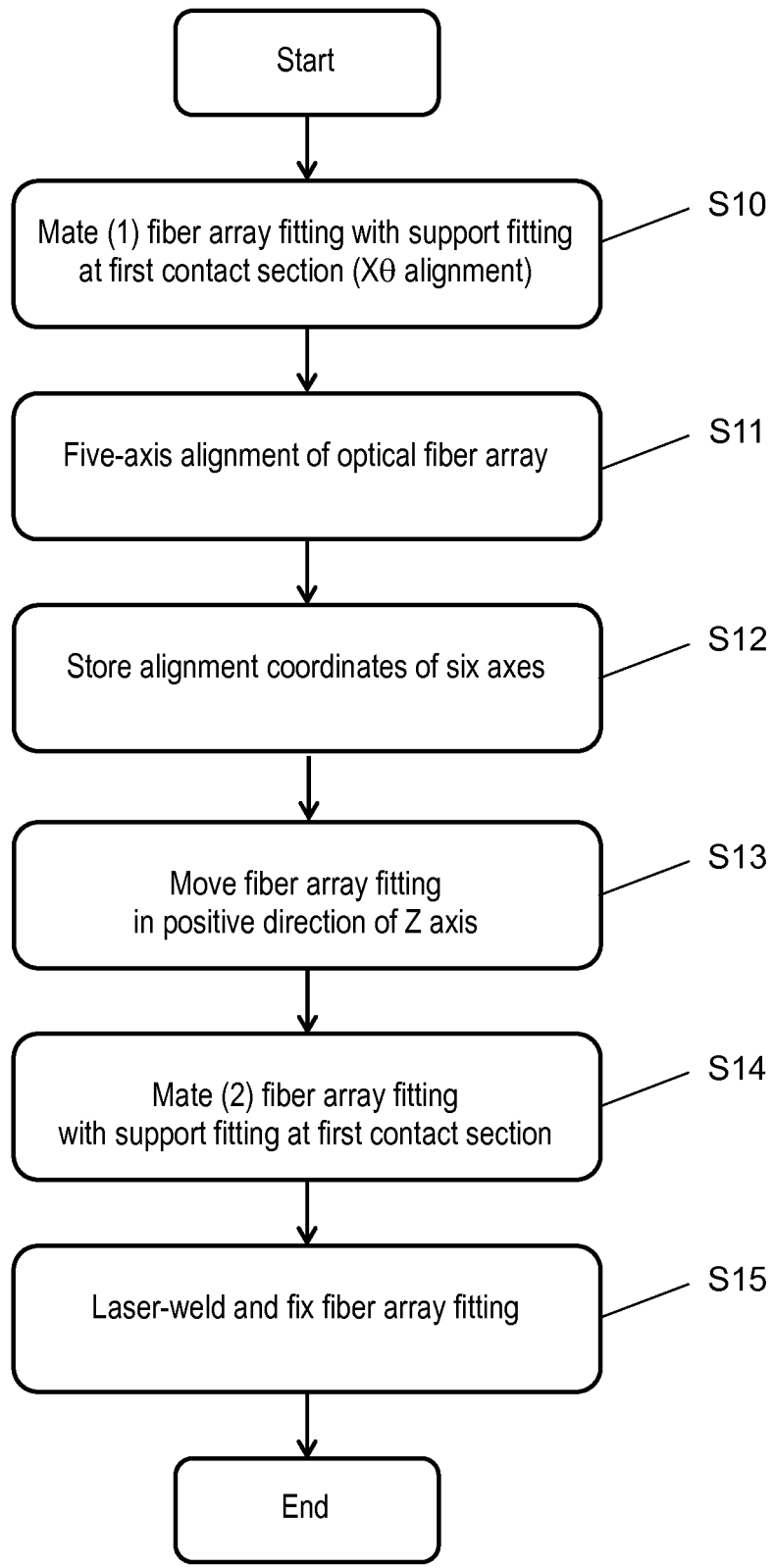
FIG. 8 is a flowchart showing an assembling process of the semiconductor laser module in accordance with the second exemplary embodiment of the present invention.

FIG. 8 shows an operation flow from the alignment of laser diode array 3 and optical fiber array 4 to the fixing of them. Here, the operation flow leads to the completion of semiconductor laser module 31 of FIG. 7A and FIG. 7B. FIG. 8 is a flowchart showing an assembling process of semiconductor laser module 31 in accordance with the second exemplary embodiment of the present invention. FIG. 9A, FIG. 9B, FIG. 10A, and FIG. 10B are plan views illustrating the assembling process of semiconductor laser module 31 in accordance with the second exemplary embodiment of the present invention, and show the arrangement of the components of semiconductor laser module 31 in each step of the operation flow.

Mating of fiber array fitting 5 with support fitting 6 at first contact section 11 as the first step of the operation flow of the assembling process is to operate fiber array fitting 5 at a high-accuracy stage to bring it into line-contact or surface-contact with support fitting 6 at first contact section 11 (step S10) As a result of the mating, fiber array fitting 5 and support fitting 6 are in line-contact or surface-contact with each other at a high accuracy, and the contact surface is parallel with the plane about the Y-axis. The mating between fiber array fitting 5 and support fitting 6 at first contact section 11 is performed accurately in step S10. Therefore, the state where fiber array fitting 5 and support fitting 6 are in surface contact with each other at a high accuracy can be reproduced also by the following manner:

fiber array fitting 5 is temporarily moved to a position separated from laser diode array 3 as described later, and then brought into surface contact with the mating surface of support fitting 6.

Therefore, YAG laser welding between fiber array fitting 5 and support fitting 6 is sufficiently easy.

Figure 9A:
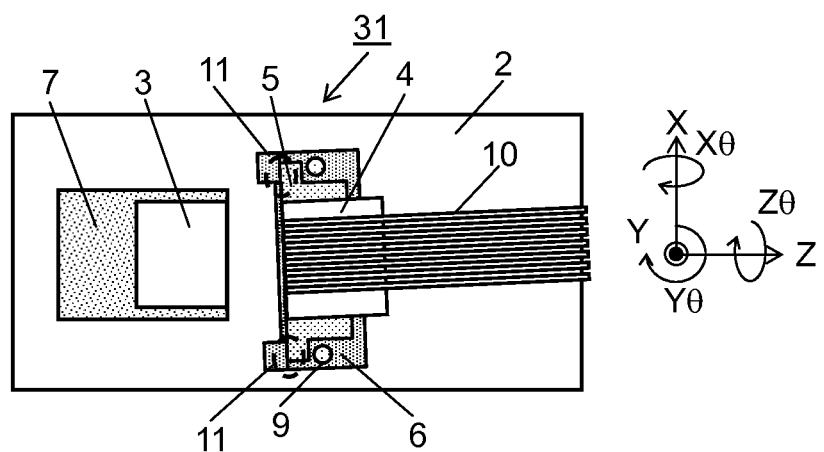
FIG. 9A is a plan view illustrating the assembling process of the semiconductor laser module in accordance with the second exemplary embodiment of the present invention.

At this time, the light receiving surface of optical fiber array 4 also becomes parallel with the plane about the Y-axis. FIG. 9A shows the arrangement of the components of semiconductor laser module 31 at the completion time of the first process.

The five-axis alignment of the optical fiber array 4 as the second step of the operation flow is to align laser diode array 3 and optical fiber array 4 with reference to five axes (X, Y, Z, Yθ, Zθ) other than the Xθ axis (step S11). As a result of the five axis alignment, optical fiber array 4 comes into a state where it is aligned with reference to a total of six axes.

Figure 9B:
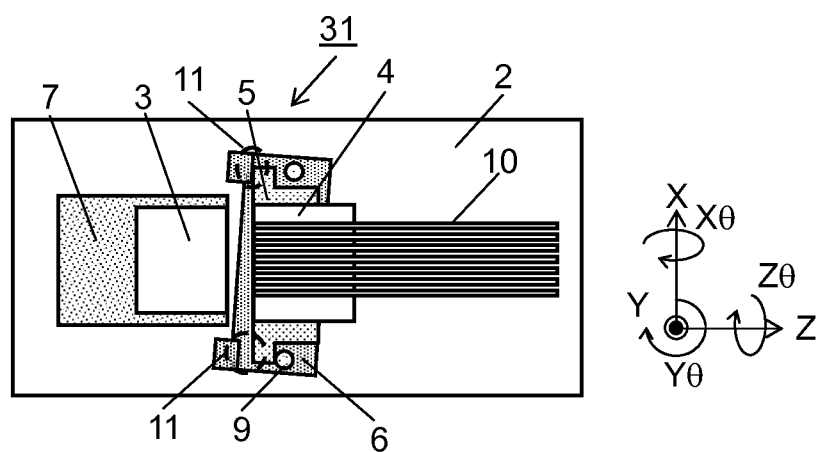
FIG. 9B is another plan view illustrating the assembling process of the semiconductor laser module in accordance with the second exemplary embodiment of the present invention.

While, support fitting 6 follows the movement of fiber array fitting 5 in response to the five-axis alignment operation, and first contact section 11 between fiber array fitting 5 and support fitting 6 is kept to be parallel with the plane about the Y-axis, but the mating state breaks. FIG. 9B shows the arrangement of the components of semiconductor laser module 31 at the completion time of the second process.

Figure 10A:
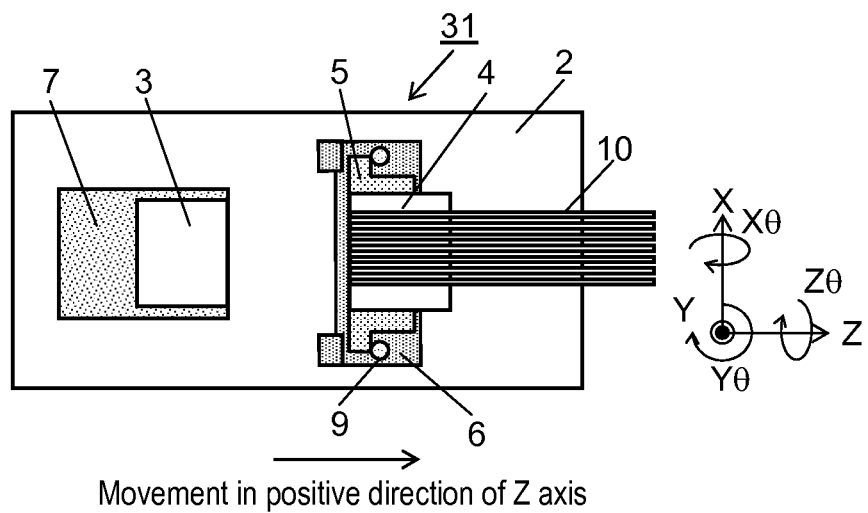
FIG. 10A is yet another plan view illustrating the assembling process of the semiconductor laser module in accordance with the second exemplary embodiment of the present invention.

Mating of fiber array fitting 5 and support fitting 6 with first contact section 11 as the third step of the operation flow is to perform, again, the mating between fiber array fitting 5 and support fitting 6 that has broken in the second step. The six-axis alignment coordinates that have been obtained in the step before the third step are stored (step S12), and fiber array fitting 5 is moved in the positive direction of the Z-axis as shown in FIG. 10A (step S13). Fiber array fitting 5 is restrained by guide pin 9 of support fitting 6, so that support fitting 6 also moves in the positive direction of the Z-axis in response to the movement of fiber array fitting 5.

Figure 10B:
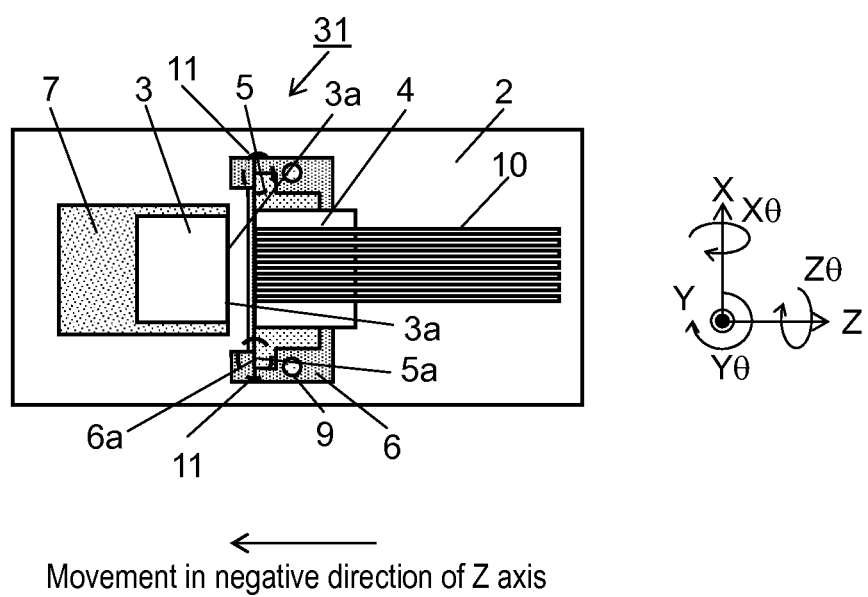
FIG. 10B is still another plan view illustrating the assembling process of the semiconductor laser module in accordance with the second exemplary embodiment of the present invention.

Then, as shown in FIG. 10B, fiber array fitting 5 is moved to the stored six-axis alignment coordinates (in the negative direction of the Z-axis) again. At this time, fiber array fitting 5 and support fitting 6 are in the same contact state as that during mating, and the support fitting moves in response to the movement of fiber array fitting 5. When optical fiber array 4 is set at the six-axis alignment coordinates stored in step S12, the contact surfaces 5a and 6a between fiber array fitting 5 and support fitting 6 are parallel with light emission surface 3a of laser diode array 3 in the same state as that during mating, namely in the accurate line-contact or surface-contact state (step S14). Plane section 21 as the contact surface between support fitting 6 and casing 2 is secured to be in an accurate line-contact or surface-contact state due to the own weight of support fitting 6 in all of the steps.

When laser welding shown in FIG. 7A and FIG. 7B as the fourth step is performed at this state, optical fiber array 4 can be fixed by laser welded sections 8a and 8b without deviation of the alignment position (step S15).

Thus, the accurate stage adjustment in the first step through fourth step is one mating and five-axis alignment, and is not different from the conventional six-axis alignment.

Thus, in the present invention, laser welding is used for fixing an optical fiber array, so that a semiconductor laser module that has no aging degradation and high reliability can be provided. In the manufacturing process of the semiconductor laser module, mating of the welded section required for alignment using the laser welding can be performed accurately and easily. Thus, optical coupling of high accuracy and high quality can be obtained without adding man-hour for adjustment and alignment, and the alignment position does not deviate when the optical fiber array is fixed. Therefore, the manufacturing yield is also improved.

In the present exemplary embodiment, guide pin 9 is taken as an example. However, there are various examples other than guide pin 9 because it is simply required that support fitting 6 follows the movement of fiber array fitting 5 in a state where support fitting 6 is in contact with the casing due to the own weight.

The semiconductor laser module of the present invention can output a laser beam of high-output and high-quality at high reliability, and is useful as a heat source or excitation source especially for an industrial laser for processing.

What is claimed is:

1. A method of manufacturing a semiconductor laser module, the semiconductor laser module including: a laser diode array; an optical fiber array having optical fibers arranged on a substrate; a fiber array fitting for fixing the optical fiber array; a casing for supporting at least the laser diode array and the optical fiber array; and a support fitting for fixing the fiber array fitting and the casing, wherein the support fitting has a plane section parallel with the casing and two columnar sections extending vertically from right and left corners on an end surface on the laser diode array side on the plane section, wherein the fiber array fitting has a first contact section that is in line-contact or surface-contact with each of the two columnar sections of the support fitting, and the fiber array fitting and the support fitting are fixed to each other by a first laser welded section in the first contact section, and wherein the plane section of the support fitting has a second contact section that is in line-contact or surface-contact with the casing, and the support fitting and the casing are fixed to each other by a second laser welded section in the second contact section; the method further comprise the steps of: a first mating step of performing Xθ alignment by mating the fiber array fitting with the support fitting at the first contact section; a five-axis alignment step of performing five-axis alignment step of performing five-axis alignment of the optical fibers to the light emission surface of the laser diode array; a step of storing alignment coordinates being obtained in the first mating step and the five-axis alignment step; a moving step of moving the fiber array fitting by a predetermined distance in the positive direction of a Z axis; a moving-again step of moving the fiber array fitting to the stored alignment coordinates of the six axes again after the moving step; a second mating step of mating the fiber array fitting with the supporting fitting at the first contact section in the alignment coordinates of the six axes; and a laser welding step of forming the first laser welded section the second laser welded section in the first contact section and the second contact section.

2. The method of manufacturing the semiconductor laser module of claim 1, wherein
the fiber array fitting has a projecting section at each of right and left ends, and a contact surface of each of the projecting sections comes into contact with a contact surface of each of the right and left columnar sections of the support fitting to form the first contact section.

3. The method of manufacturing the semiconductor laser module of claim 1, wherein
when the optical fiber array is aligned, the support fitting, due to the own weight, is in line-contact or surface-contact with the casing on the plane section that is vertical to a light emission surface of the laser diode array.

4. The method of manufacturing the semiconductor laser module of claim 1, the semiconductor laser module further including:

a guide pin for guiding the support fitting so that the support fitting follows movement of the fiber array fitting in a plane that is vertical to a light emission surface of the laser diode array, wherein the guide pin is press-fitted into the support fitting.

5. The method of manufacturing the semiconductor laser module of claim 2, wherein when the optical fiber array is aligned, the support fitting, due to the own weight, is in line-contact or surface-contact with the casing on the plane section that is vertical to a light emission surface of the laser diode array.

6. The method of manufacturing the semiconductor laser module of claim 2, the semiconductor laser module further including:

a guide pin for guiding the support fitting so that the support fitting follows movement of the fiber array fitting in a plane that is vertical to a light emission surface of the laser diode array, wherein the guide pin is press-fitted into the support fitting.

7. The method of manufacturing the semiconductor laser module of claim 1, wherein the fiber array fitting is arranged above the plane section of the support fitting, and the fiber array fitting and the plane section of the support fitting are fixed apart from each other.

8. The method of manufacturing the semiconductor laser module of claim 2, wherein the fiber array fitting is arranged above the plane section of the support fitting, and the fiber array fitting and the plane section of the support fitting are fixed apart from each other.

9. The method of manufacturing the semiconductor laser module of claim 3, wherein the fiber array fitting is arranged above the plane section of the support fitting, and the fiber array fitting and the plane section of the support fitting are fixed apart from each other.

10. The method of manufacturing the semiconductor laser module of claim 4, wherein the fiber array fitting is arranged above the plane section of the support fitting, and the fiber array fitting and the plane section of the support fitting are fixed apart from each other.

11. The method of manufacturing the semiconductor laser module of claim 5, wherein the fiber array fitting is arranged above the plane section of the support fitting, and the fiber array fitting and the plane section of the support fitting are fixed apart from each other.

12. The method of manufacturing the semiconductor laser module of claim 6, wherein the fiber array fitting is arranged above the plane section of the support fitting, and the fiber array fitting and the plane section of the support fitting are fixed apart from each other.

* * * * *